(12) United States Patent
Johnson et al.

(10) Patent No.: US 11,029,335 B1
(45) Date of Patent: Jun. 8, 2021

(54) SELECTIVELY GEOMETRIC SHAPED CONTACT PIN FOR ELECTRONIC COMPONENT TESTING AND METHOD OF FABRICATION

(71) Applicant: Johnstech International Corporation, Minneapolis, MN (US)

(72) Inventors: David Johnson, Wayzata, MN (US); Michael Andres, Inver Grove Heights, MN (US); Neil Graf, St. Paul, MN (US); Kenna Pretts, Coon Rapids, MN (US)

(73) Assignee: JOHNSTECH INTERNATIONAL CORPORATION, Minneapolis, MN (US)

( * ) Notice: Subject to any disclaimer, the term of this patent is extended or adjusted under 35 U.S.C. 154(b) by 216 days.

(21) Appl. No.: 16/115,704

(22) Filed: Aug. 29, 2018

Related U.S. Application Data

(63) Continuation of application No. 15/137,408, filed on Apr. 25, 2016, now Pat. No. 10,114,039.

(60) Provisional application No. 62/152,187, filed on Apr. 24, 2015.

(51) Int. Cl.
    *G01R 1/067* (2006.01)
    *H01R 4/58* (2006.01)
    *H01R 43/16* (2006.01)

(52) U.S. Cl.
    CPC .......... *G01R 1/06738* (2013.01); *H01R 4/58* (2013.01); *H01R 43/16* (2013.01)

(58) Field of Classification Search
    CPC ...... G01R 1/0491; G01R 3/00; G01R 1/0416; G01R 1/06738; H01R 43/16; H01R 12/58; H01R 12/585; H01R 12/51–57; H01R 4/58; H05K 2201/10613; Y10T 29/49204; Y10T 29/49224
    USPC .................................................. 29/885, 874
See application file for complete search history.

(56) References Cited

U.S. PATENT DOCUMENTS

| | | | | |
|---|---|---|---|---|
| 3,058,091 A | * | 10/1962 | Henschen | H01R 13/111 439/851 |
| 3,273,108 A | * | 9/1966 | Radocy | H01R 31/02 439/724 |
| 4,857,019 A | * | 8/1989 | Brubaker | H01R 12/585 439/751 |
| 5,193,271 A | * | 3/1993 | Kato | H01R 43/16 29/885 |
| 5,207,584 A | * | 5/1993 | Johnson | G01R 1/0433 439/66 |

(Continued)

*Primary Examiner* — Peter Dungba Vo
*Assistant Examiner* — Kaying Kue
(74) *Attorney, Agent, or Firm* — Hamre, Schumann, Mueller & Larson, P.C.

(57) ABSTRACT

This disclosure relates to a method of fabrication contact pins 24 used in testing circuit components, typically integrated circuits and the contact pins themselves. It is desirable to selectively radius certain portions of each pin to achieve desired performance of the entire pin. The portion to be radiused is cut to the desire shaped from a blank material. The portion which is not to be radiused is not cut to its final shape from the blank but to a larger shape which includes the material for the final shape. The entire cut portion is then treated to shape tor round all exposed edges. Then the remaining portion of the pin is cut out from the larger blank area which was previously retained, leaving those portions with non-radiused edged.

10 Claims, 8 Drawing Sheets

(56) References Cited

U.S. PATENT DOCUMENTS

| | | | | |
|---|---|---|---|---|
| 5,495,669 | A * | 3/1996 | Legrady | H01R 4/028 |
| | | | | 29/883 |
| 5,567,335 | A * | 10/1996 | Baessler | B23K 11/34 |
| | | | | 219/61.2 |
| 6,360,437 | B1 * | 3/2002 | Fukumoto | C25D 5/10 |
| | | | | 29/825 |
| 6,727,579 | B1 | 4/2004 | Eldridge et al. | |
| 6,815,961 | B2 * | 11/2004 | Mok | G01R 1/07371 |
| | | | | 324/756.03 |
| 6,854,981 | B2 | 2/2005 | Nelson | |
| 6,917,525 | B2 | 7/2005 | Mok et al. | |
| 7,316,064 | B2 * | 1/2008 | Chou | C25D 5/50 |
| | | | | 29/874 |
| 7,339,293 | B2 | 3/2008 | Frank et al. | |
| 7,639,026 | B2 * | 12/2009 | Shell | G01R 1/0466 |
| | | | | 324/754.03 |
| 2002/0020340 | A1 * | 2/2002 | Dietze | C30B 15/10 |
| | | | | 117/30 |
| 2002/0045365 | A1 * | 4/2002 | Lee | H05K 7/1023 |
| | | | | 439/66 |
| 2002/0117330 | A1 | 8/2002 | Eldridge et al. | |
| 2003/0141948 | A1 * | 7/2003 | Maekawa | H01P 11/007 |
| | | | | 333/204 |
| 2004/0217771 | A1 * | 11/2004 | Leong | G01R 1/0466 |
| | | | | 324/754.08 |
| 2004/0248448 | A1 * | 12/2004 | Gilk | H01R 13/2435 |
| | | | | 439/264 |
| 2008/0116927 | A1 | 5/2008 | Dozier et al. | |

\* cited by examiner

SELECTIVELY GEOMETRIC SHAPED CONTACT PIN FOR ELECTRONIC COMPONENT TESTING AND METHOD OF FABRICATION

BACKGROUND

Field of the Disclosure

The present disclosure relates broadly to the field of testing of electronic devices such as integrated circuits. More narrowly, however, the disclosure deals with the contact pins used in component testers for interfacing pads or leads of a device under test (DUT) with corresponding pads of a load board, or circuit board which receives signals from the component through the pins and preforms the test. A specific embodiment of the disclosure illustrates forming and fabricating pins.

Background

The testing of integrated circuit devices is performed to ensure that such devices, when sold to a customer, are of a high degree of quality as possible. Various types of test apparatus have been utilized over the years to accomplish testing. Typically, a tester includes a load board or printed circuit board which has defined thereon a plurality of conductive traces. These traces on the circuit board, or load board, are associated with corresponding functions of the test apparatus.

In order to accomplish testing, it is necessary to interconnect a lead, in the case of a leaded device under test (DUT), or a pad, of a nonleaded device under test, to a corresponding trace on the load board. A test set or test socket having a plurality of contacts is interposed between the device under test and the load board in order to effectuate interconnection. A contact is engaged, at an upper end thereof, by the lead or pad of the DUT, depending upon the type of DUT being tested, with its corresponding trace on the load board. A lower end of the contact is in engagement with a trace on the load board.

As technology has progressed, the size, shape and electronic properties of contacts have evolved in response to the construction of test sets and load boards and the architecture of devices to be tested. A wiping action (i.e., the process of removing oxides on the contacts or contact pins by translational movement) between the tip of the pin which connects to the DUT is considered advantageous. Such wiping action is deemed to facilitate a good transmission path through the contact because of a good connection at either end thereof. The wiping action between the load board and the pin is advantageous, but it is also damaging in ways which are not applicable to the DUT. Since the DUT only resides in the test set or test socket once, the abrasion caused by wiping action occurs only once. The wiping action between the load board and the lower part of the pin will occur thousands of times. Since the lower pin portion and load board are in constant contact (unlike the DUT), there is less need for constant wiping. Furthermore, load boards are expensive and the wear on them by unnecessary wiping action is to be avoided.

Previous solutions such as those by Johnstech International Corporation in U.S. Pat. Nos. 7,339,293, 7,639,026 and 6,854,981, the disclosures of these being hereby incorporated by reference as background, have provided excellent solutions, primarily by providing for a rolling action of the lower pin on the load board rather than a scraping action.

In cases with the upper and lower portions of the contact pin are joined or unitary, whatever movement occurs in the upper portion is necessarily transmitted into the lower portion. This creates a problem in the wiping action of the upper and lower portions which need not or should not be the same.

One previously known solution to increasing the effectiveness of the wiping action on the DUT/upper pin interface is to take the edge off the pin. This causes the pin to penetrate the DUT contact surface more effectively and shed debris and oxides. The problem with this prior art solution is that polishing of the edge of the upper portion of the pin, necessarily polishes the entire pin since regardless of what polishing process is used. The pins are much too small to selectively mechanically polish only part of the pin.

Therefore, there is a need to minimize any wear on the load board without compromising the effective wiping action on the DUT.

BRIEF SUMMARY

To assist the reader in preparing to digest the detailed description and claims below, a short summary has been provided. It is far from complete and only provides a glimpse of the invention concepts. It is not intended to define the scope of the invention. The claims perform that function.

The present disclosure shows a method of selectively rounding/radiusing or smoothing edge portions of a contact pin such that only areas for which rounding is desired are radiused and portions which require straight edges are unaffected. The disclosure also shows a pin with selectively radiused edges.

Disclosed is a method of making contact pins for use in integrated circuit testing where said pins have sidewalls which are joined at edges which are initially sharp edges and which some of the edges are then selectively radiused comprising any or all of the following steps in any order:
  a. forming a blank of electrically conductive planar material; or just planar material (which can be plated later)
  b. defining the partial outline of a plurality of pins on the blank, defining includes determining where to make cuts, programming a cutting machine, marking the blank with cut lines or similar;
  c. cutting the blank along said outline to separate from a blank of partially formed pins and all still attached to the blank, cutting can be done by various known means, such as EDM, laser, water jet, photo etch, or mechanical cutting;
  d. radiusing of the pins at the edges exposed from cutting away of the blank, radiusing includes the process of removing material from the intersection of sidewalls to remove the sharp/straight orthogonally edges to form rounded edges. The radiusing of exposed edges will preferably radius all exposed edges even if some exposed areas will not have contact with the load board or DUT.
  e. defining an outline of the remaining portion of the pins in the blank;
  f. cutting the blank away to create a plurality of singulated pins completely separated from the blank; the final cutting step finishes the definition of the pin shape and separates the pins from the remaining blank material, making them singular pins, or singulated;
    so that the resultant singulated pins have edges which are radiused and edges which are straight. The result is that the pins have sharp and radiused edges according to user specification.

The disclosure also includes a method where the blank has substantially straight sidewalls joining to form a sharp edge at the intersection of the sidewalls and wherein the step of radiusing includes rounding the sharp edge to create a rounded edge at the intersection.

The disclosure also includes a method where the radiusing step includes mechanical rounding of said edges.

The disclosure also includes a method where the radiusing step includes chemically rounding of said edges.

The disclosure also includes a method where the radiusing step includes electrically rounding of said edges.

The disclosure also includes a method where the radiusing step includes thermal rounding of said edges.

The disclosure also includes a method where the contact pins for use in integrated circuit testing where said pins have sidewalls which join at edges which are initially sharp edges and which some of the edges are then selectively radiused comprising the steps of:
 a. forming a blank of electrically conductive planar material;
 b. defining the partial outline of a plurality of pins on the blank;
 c. cutting the bank along said outline to separate from a blank of partially formed pins and all still attached to the blank;
 d. coating a portion of the pin with a chemical resist coating material in areas where radiusing is not desired; the resist material includes materials which are capable of resisting chemicals which would otherwise attack the blank material;
 e. cutting the blank away to create a plurality of singulated pins completely separated from the blank, with portions coated;
 f. chemically radiusing of the pins at the edges not coated; removing the coating material; exposed edges as well as path connecting edges, may be radiused so as to produce a radius or no radius as desired or specified by user;
 so that the resultant singulated pins have edges which are radiused and edges which are straight.

The disclosure also includes a method where the uncoated edges of said pins are chemically radiused.

The disclosure also includes a method where the chemical radiusing cannot reach said coated areas.

The disclosure also includes a method where removing the coating material includes immersing the singulated pins into a bath of chemical solution capable of or removing the coating material without affecting the pin edges.

The disclosure also includes a contacts pin for use in integrated circuit testing comprising:
 a. an upper portion of the contact pin configured to engage a contact point on a device under test;
 b. a lower portion of the contact pin configured to engage a contact point on a load board;
 c. a connecting body between said upper and lower portions;
 d. said upper portion having sidewalls which come together at a longitudinal upper intersection region, said upper intersection region having a radiused edges so that it is rounded;
 e. said lower portion having sidewalls which come together at a lower longitudinal intersection region, said lower intersection region having sharp edges;
 so that said upper and lower edges are selectively rounded according to user specification.

The disclosure also includes wherein the contact pin has an upper portion which is radiused in a region which contacts the device under test.

The disclosure also includes wherein the contact pin has a lower portion is sharp in a region which contacts the load board.

DETAILED DESCRIPTION

As mentioned above, there is an advantage to having contact pins which can be fabricated with selective areas which are geometrically shaped, radiused or rounded while leaving other areas with straighter, non-shaped/rounded areas. The terms "geometrically shaped" or "rounded" and "straight" are to be considered relative to each other. A straight edge is primarily one where the cross sectional profile created when a contact pin part is cut from a sheet of material, such as by EDM, laser, water jet, photo etch, or mechanical cutting. Such edges are considered "straight" and have orthogonal edges or profiles. They can also be considered straight when they are de-burred (if needed) or with limited polishing. These edges have corners and sidewalls which are substantially orthogonal. Removal of burrs, in many cases will actually make them even straighter. Limited polishing should also be considered within the meaning of straight.

Figure 12:
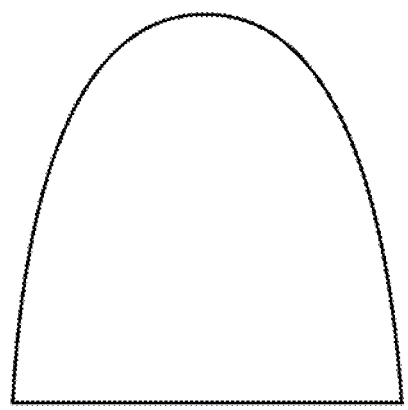
FIG. 12 is a close up sectional view of a pin top profile for use with DUT.
Figure 13:
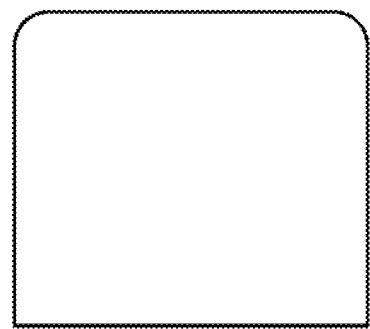
FIG. 13 is a close up sectional view of a bottom pin profile for contact with the load board, or a top pin profile as further explained below.

Geometric shaping, such as rounding, radiusing, polishing or equivalent, produces a pronounced curvature at the intersection of the generally orthogonal sidewalls. In effect shaped areas substantially lack corners. Note also that more than the corners/edges can be shaped. Since there are two edges on the blank/pin, the shaping can be limited to the edges or extend from one edge to the other so that the entire surfaces is rounded edge to edge (see FIG. 12).

Selective shaping refers to the inventive concept of identifying portions of the pin which will be shaped rather than indiscriminate or complete shaping. Amongst the other advantages mentioned above, shaping creates less debris which can cause electrical test failure. Furthermore, selective shaping can be combined with electroplating, preferably after shaping, to further enhance the smoothness of the contact and minimize debris shedding from the pin. Of course most of debris is coming from the pad or ball contact on the DUT and dropping down to the load board. The shaped foot on the pin is less likely to be affected by debris as a smaller area of load board contact is now involved.

Figure 1:
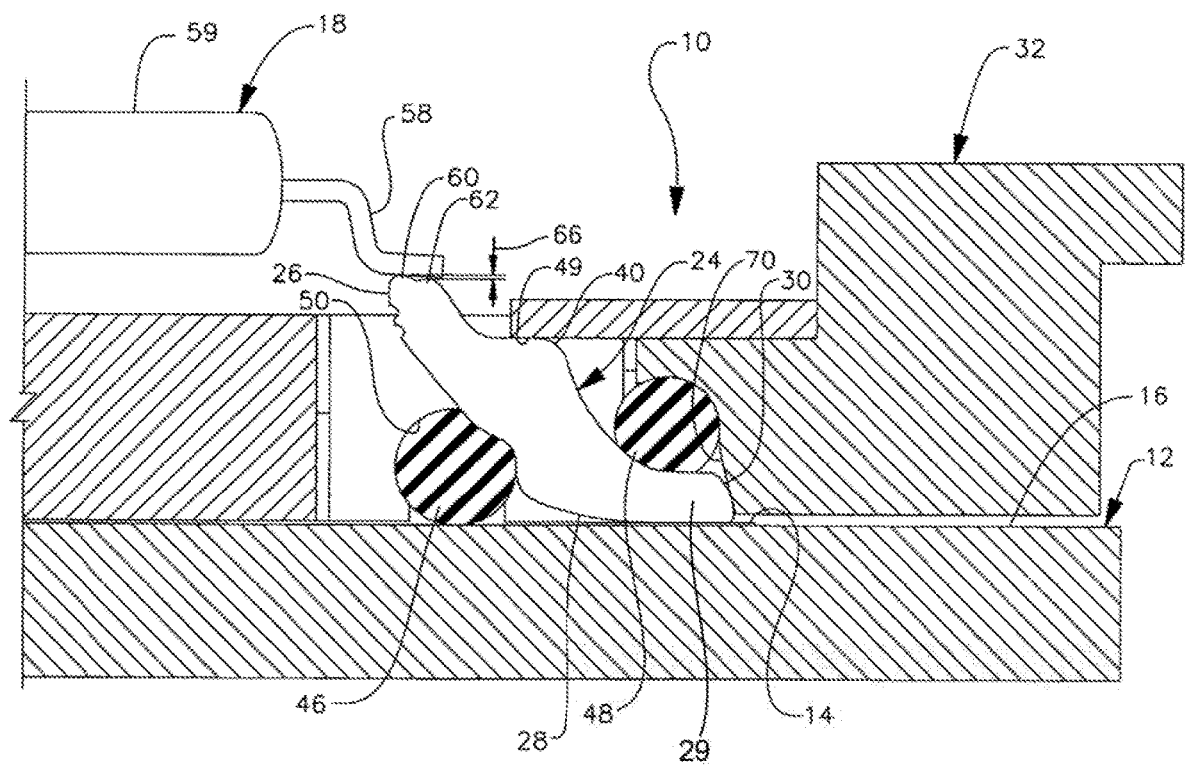
FIG. 1 is a side elevational view of a test set employing a contact, some portions being shown in section.
Figure 2:
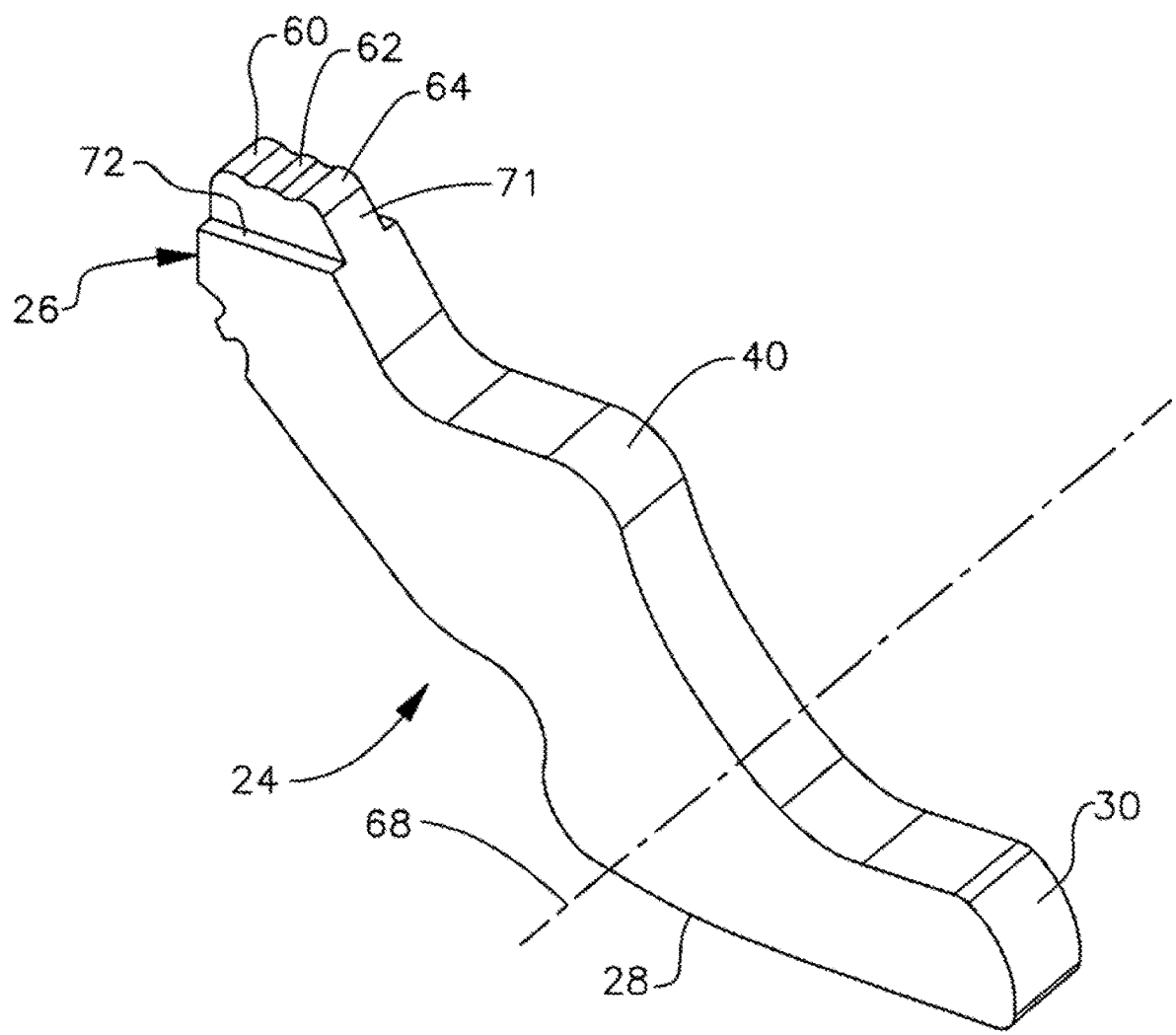
FIG. 2 illustrates a pin in perspective.

Referring now to the drawing figures, wherein like reference numerals denote like elements throughout several views. FIGS. 1 and 2 illustrate a known prior art test socket 10 as shown in U.S. Pat. No. 7,639,026 to Shell et. al. and provide background to this disclosure, and also incorporated by reference. The test socket 10 is intended for use with a tester typically employed for ascertaining quality of integrated circuit devices used in electronic appliances. The tester interfaces with a tester load board 12 which has electrically conductive traces 14 formed on a load board surface 16 thereof to enable electronic communication between the tester and an integrated circuit device 18 to be tested. That is, electrical signals are transmitted between the device under test 18 and the test apparatus through the test socket 10.

It will be understood that various types of integrated circuit devices 18 are able to be tested utilizing a test socket or test set in accordance with the present invention. FIG. 1 illustrates a leaded device having externally-extending leads 58 diverging from the body 59 of the device 18. It will be understood, however, that leadless devices, as illustrated in FIG. 2, can be accommodated. Such devices have pads rather than leads 58.

While it is to be understood that FIG. 1 illustrates a device under test (DUT) package in an elevational view showing a single lead, a plurality of leads 58 are typically part of the device 18. In such cases, a contact pin 24, as will be discussed hereinafter, will be provided for engagement by each lead 58. It will be understood that substantially identical leads extend, in the case of the type of device 18 illustrated, along both of opposite sides of the device package 18.

In operation, downward pressure is brought to bear upon the leads or pads of the device 18 by a plunger mechanism (not shown). As the plunger depresses the device 18 downward, contact pins 24, which are mounted in an elastomeric fashion as will be discussed hereinafter, are caused to be rotated with respect to an axis which extends generally perpendicular to a plane defined by the contact pin 24. An axis with respect to which contact 24 might rotate is identified by reference numeral 68 in FIG. 2.

FIG. 1 illustrates a location of the device 18 and an orientation of contact pin 24 when lead 58 has first engaged the front, or inner, end 26 of contact pin 24.

The contact pin 24 illustrated in the drawing figures includes a protrusion 40. Protrusion 40 functions to engage, when mounted by elastomers 46-48, a shoulder 49 defined by the housing 32. Engagement of the shoulder 49 by protrusion 40 serves to limit the degree of upward movement of the contact pin 24 and the distance the front end 26 of the contact pin 24 will extend beyond an upper surface of the housing 32 when the contact pin 24 is not engaged by a device to be tested.

As previously discussed, elastomers 46, 48 affect mounting of contact pin 24. The test socket housing 32 is, therefore, provided with a pair of channels 50, which extend along axes generally transverse to a plane defined by contact pin 24 when it is mounted in the housing 32. Elastomers 46, 48 are received within channels 50. Rear elastomer 48 is pre-loaded and, as a result of the arcuate surface 28 at the rear end/tail 30 of contact pin 24 being in engagement with the load board 12 on surface 29, will engage an upper edge of the rear end 30 of contact pin 24 at a location to urge the front end 26 of contact pin 24 upwardly. Similarly, front elastomer 46 is under compression and also serves to urge contact pin 24 upward. Contact pin 24 will, in its neutral orientation, be positioned and oriented as seen in FIG. 1. This is a first orientation of contact pin 24 and the one it occupies prior to a device 18 being brought into engagement with the upper end 26 of contact pin 24 by device 18.

Figure 3:
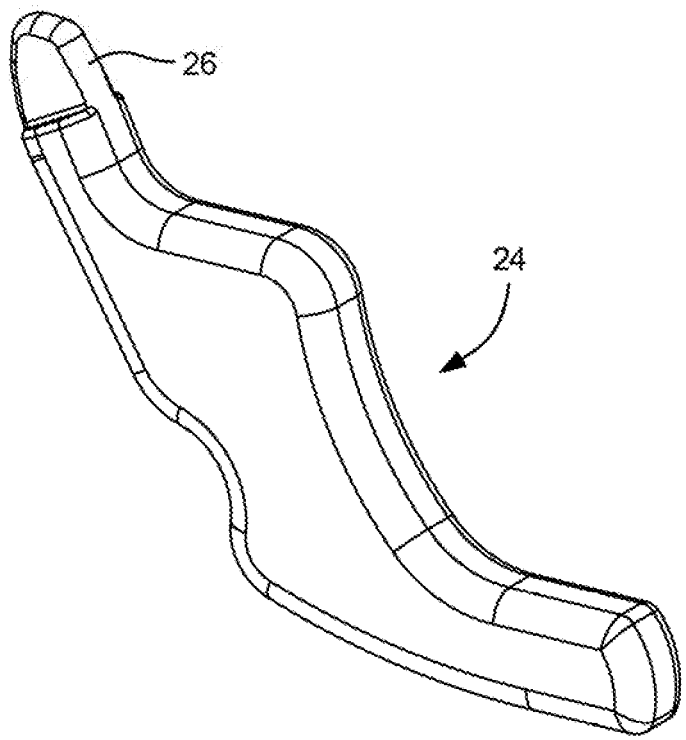
FIG. 3 is a perspective view of a pin which has been fabricated with rounded edges on all surfaces.

FIG. 1 illustrates multiple contact points defined by upper end 26 of contact pin 24. The contact points are, as best seen in FIG. 2, generally parallel extending ridges 60, 62, 64. While FIG. 3 illustrates three parallel ridges extending generally parallel to the axis 68, a smaller contact, as shown in FIG. 1, might well be provided with only two ridges 60, 62 or none at all.

FIG. 1 illustrates the locations of ridges 60, 62 relative to each other at the time of first engagement by lead 58 of device 18. It will be noted that ridge 60 is engaged by lead 58, and ridge 62 is not. The spacing between lead 58 and ridge 62, when the contact pin 24 is in this orientation, is illustrated by reference numeral 66.

As pressure continues to be applied to device 18, contact pin 24 will be caused to rotate generally counterclockwise about axis 68 as shown in FIG. 2. At some point, lead 58 will engage ridge 62, and ridge 60 will be rotated downwardly away from lead 58. In the case of a three-ridge embodiment, second ridge 62 will also be withdrawn from lead 58 as third ridge 64 engages the lead.

It has been found that such a multiple contact point contact pin 24 is particularly effective in dealing with matte tin typically provided on lead 58 to facilitate soldering to an ultimate host board. The multiple ridge construction serves to help control a buildup of tin on front end 26 of contact pin 24. The first ridge 60 has a tendency to collect the most tin. A non-desirable buildup is deterred by providing multiple ridges. The first ridge serves a sacrificial function in absorbing the greatest transfer of tin.

FIG. 2 illustrates a contact pin 24 having a narrowed front end or tip 26. Such an embodiment defines a smaller land 71 with spaced shoulders 72 on either side thereof. Such a feature, it is envisioned, would be used when the device being tested were leadless and had a pad generally flush with the bottom of the body of the device 18. Such a land embodiment could even serve to function in an environment wherein the pad or pads of the DUT are recessed within the body of the integrated circuit.

Figure 4:
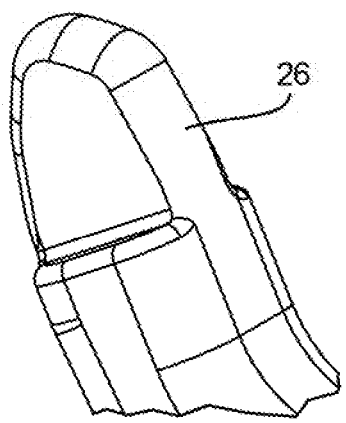
FIG. 4 is a close up fragmentary view of the tip shown in FIG. 3.
Figure 5:
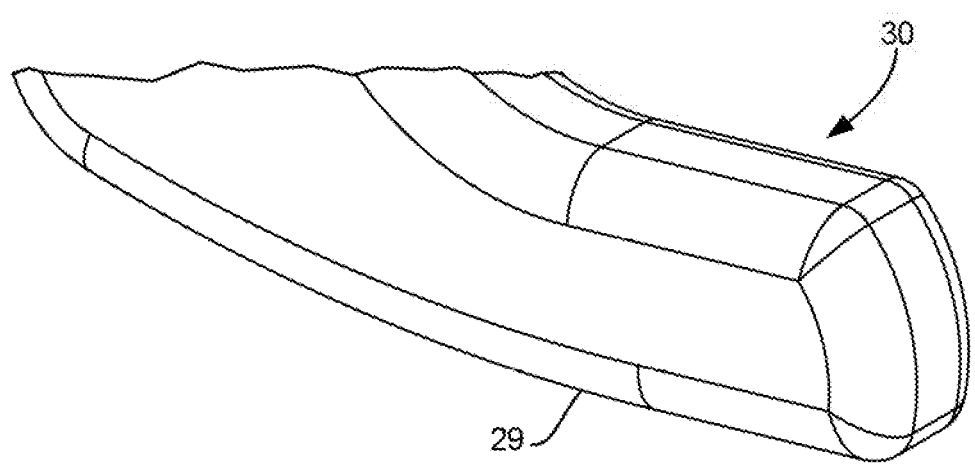
FIG. 5 is a close up fragmentary view of the tail shown in FIG. 3.

FIGS. 3, 4 and 5 illustrate a pin 24 with all surfaces smoothed. This is achieved by mechanically or chemically polishing the pin part after it has been cut from a blank. It is impractical to smooth only some surfaces of singulated pins because of their size. The preferred embodiment does not involve smoothing of the lower portion of the tip which contacts the load board; however an alternative embodiment has the lower portion which contacts the load board selectively shaped where the upper portion which contacts the DUT is not selectively shaped.

Figure 6:
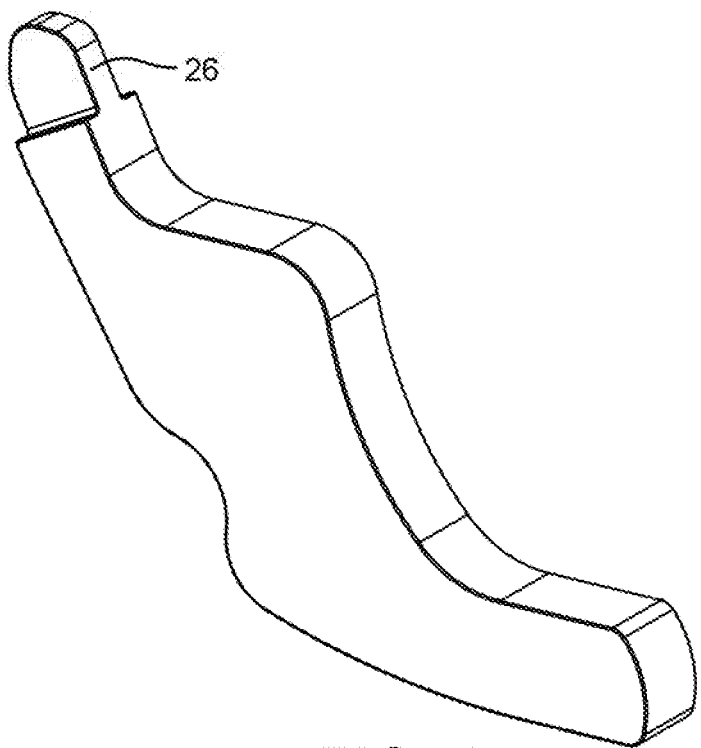
FIG. 6 is a perspective view of a pin which has been fabricated with straight edges on all surfaces except the upper portion/tip.
Figure 7:
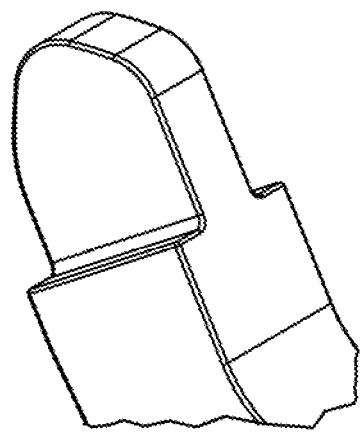
FIG. 7 is a close up fragmentary view of the tip shown in FIG. 6.
Figure 8:
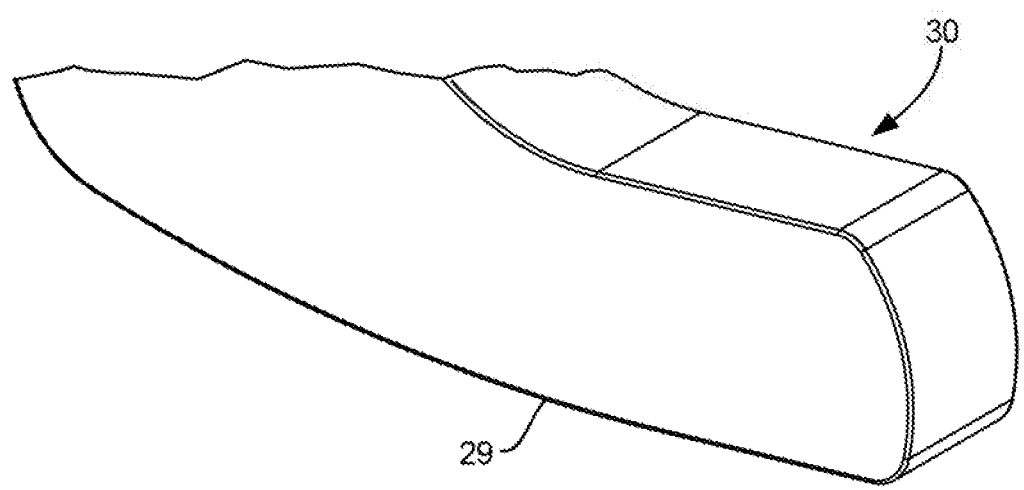
FIG. 8 is a close up fragmentary view of the tail shown in FIG. 6.

FIGS. 6, 7 and 8 are similar to FIGS. 3-5 except that none of the surfaces are smoothed or polished.

Figure 9:
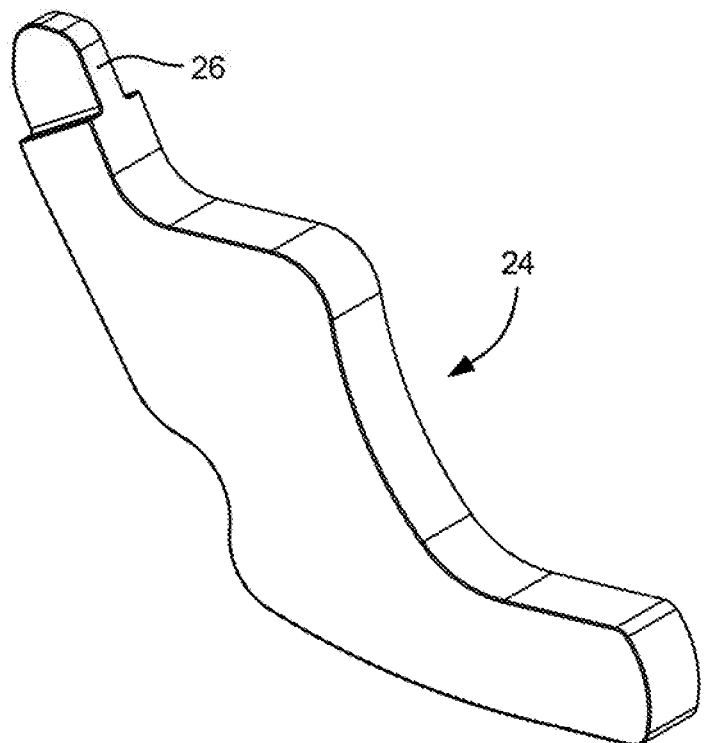
FIG. 9 is a perspective view of a pin which has been fabricated with selectively rounded edges on some surfaces.
Figure 10:
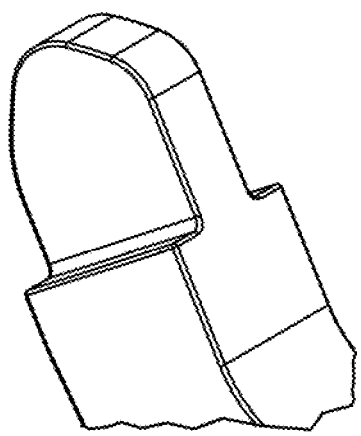
FIG. 10 is a close up fragmentary view of the tip shown in FIG. 9.
Figure 11:
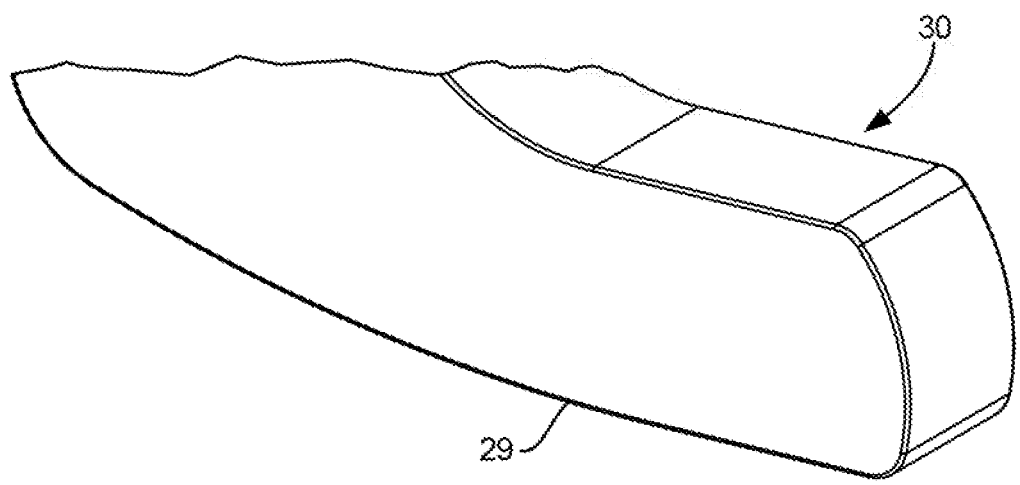
FIG. 11 is a close up fragmentary view of the tail shown in FIG. 9.

FIGS. 9, 10 and 11 show the tip 29 which has fully smoothed/rounded surfaces where it comes into contact with the DUT contact. The lower end 30 and preferably surface 29 which contacts the load board 16 has straight edges or relatively less rounded/smoothed/radiused surfaces than the tip. These straight edges distribute the force over a greater area than the rounded surfaces and thus cause less wear on the load board. Since the load board to pin contact is less likely to accumulate oxide, it does not need as much wiping action, and indeed damage to the load board entails a serious expense.

Because of the small size of pins used to test integrated circuits, they are cut from a larger flat blank of sheet material by mechanical cutting, EDM, laser or other known technique.

The following are two methods for smoothing only selected portions of the pins. The preferred objective is to smooth, polish, geometrically shape, only the surfaces which come into contact with the DTU or conversely, avoid smoothing only the surfaces which come into contact with the load board.

One solution is to cut the tip or upper portion of the pin from the blank and cut the remainder of the pin from the blank but not along the final outline of the pin. That is, a portion of the blank is retained at the lower portion or at least the portion adjacent the bottom surface 29, so that the bottom surface is not fully cut from the blank. The pins, even not fully cut out from the blank, are now separate pieces which can then be smoothed by known means. This will smooth all exposed surfaces of the pin, but because the lower portion of the pin has not been cut away from the blank, its edges are not exposed to smoothing. Once the smoothing action is complete, the lower portion of the blank can be cut away by EDM or other known means and the part it not smoothed again. This leaves the upper portion of the pin smoothed and the lower portion which was cut free from the blank unsmoothed or straight since it was cut from the blank after smoothing.

Another method of smoothing involves cutting the entire pin from the blank in one step, but coating/masking the lower portion of the pin with a chemical resistant covering. Once the pin is chemically smoothed, the coating is chemically removed by a solvent for that coating. The result is a selectively smoothed part.

Another method of smoothing/shaping may include stamping/fine-blanking which will produce a rolled and broken edge that can eliminate the flat cut edge, especially with an aggressive deburring afterwards. In this manner, the curved edge can be "roughed in" with the initial mechanical forming and then finished with an electrical, chemical, etc. process afterward.

Also, EDM cutting or other mechanical cutting can be used with the cutting wire/element at an angle in order to cut a chamfer on the surface.

It also includes a method where the raw material/blank is thicker than the finished pin and is formed or cut on all sides.

Of course these methods are equally applicable with the power portion is shaped and the upper portion is not, or where any portion is to be selectively shaped.

Figure 14:
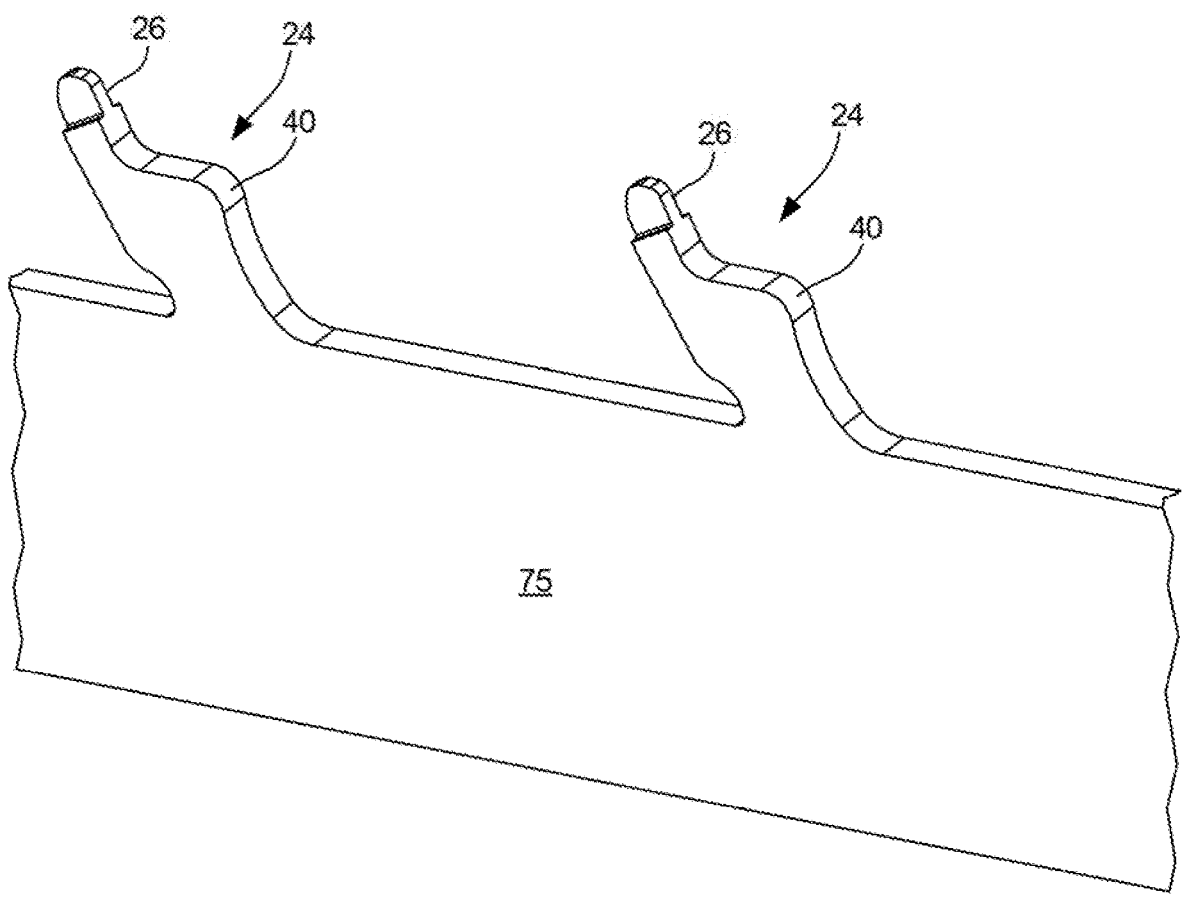
FIG. 14 is a perspective view of a series of pins partially cut from a blank.
Figure 15:
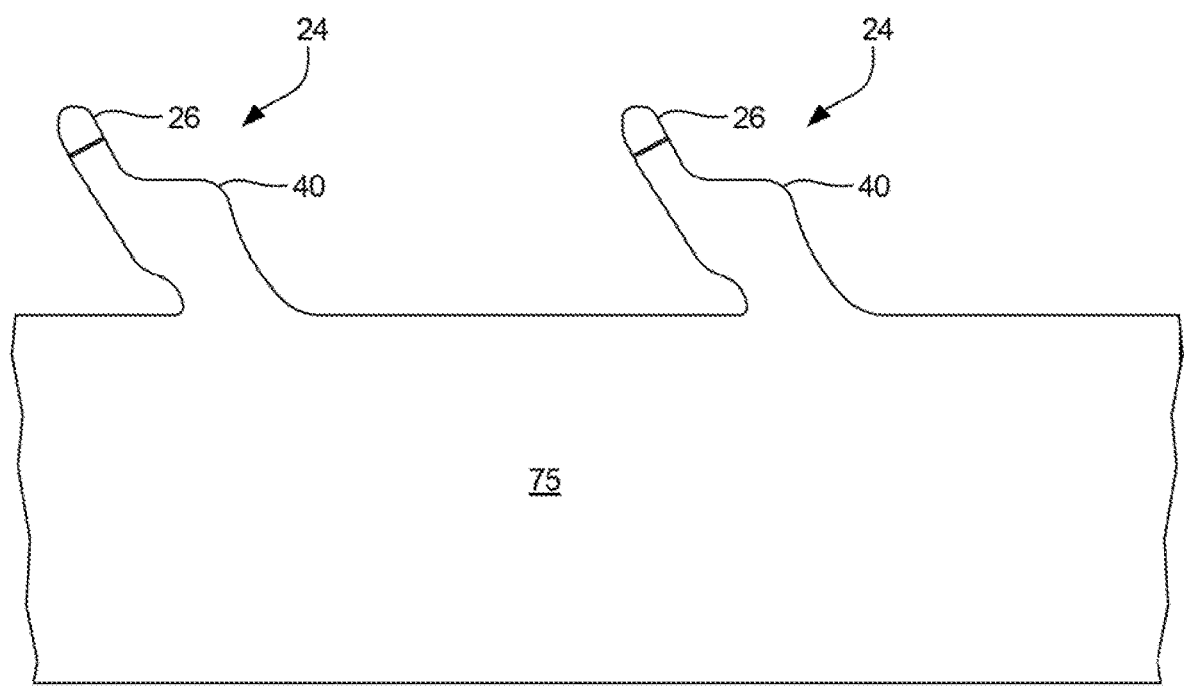
FIG. 15 is a plan view of FIG. 14.

FIGS. 14 and 15 illustrate a blank 75 of appropriate material which has been partially cut to expose the upper portion of pins 24. In the preferred embodiment, the cutting is accomplished by EDM (electrical discharge machining) or laser cutting or other means as explained above, and only the upper portion of the pin is cut away from the blank. The demarcation between what is cut and what is left uncut may be determined, in part, by how strong the cut out portion is in resisting bending during polishing. The preferred embodiment will minimize what is cut out since only the tip needs to be cut out in most cases. Aside from the strength issue, the only part which needs be retained as part of the blank is the bottom edge/surface 29, which must not be exposed.

Once the first portion of the pin has been cut from the blank, the strip of partially cut blanks needs to be mechanically or chemically treated to radius all edges. Such treatments for rounding edges or deburing of metal parts are known in the art.

Once the radiusing step has been completed the blanks 75 are then cut to complete liberate the entire pin(s) from the blank.

The resultant pins are radiused on all edges except those which were cut from the blank in the second step because those portions are never radiused. These pins thus have radiusing only where desired and straight edges likewise where desired. Of course there are portions for which does not matter whether they are radiused or not.

The above description and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A method of making planar contacts pins for use in integrated circuit testing where said pins have sidewalls which join at edges which are initially sharp edges and which some of the edges are then selectively radiused comprising the steps of:
   a. forming a blank of planar material;
   b. defining a shape of a pin in the form of an outline of a pin on the blank;
   c. removing part of the blank along the outline to partially physically separate part of the pin with the a remaining portion of the pin still attached to the blank, thereby creating sharp corner edges where the blank has been removed;
   subsequently, after cutting the blank along said outline, and exposing said sharp corner edges, rounding all said sharp corner edges of the blank thereby removing said sharp corner edges of the partially physically separate part of the pin;
   d. after rounding all said sharp corner edges, cutting the blank away from the remaining portion of the pin outline to create a singulated pin completely separated from the blank, thereby the remaining portion creating edges of the pin which are not radiused and retain sharp corner edges;
   so that the singulated pin which results has some edges are radiused and some edges are not radiused on different portions of the singulated pin.

2. The method of claim 1 wherein the blank has substantially straight sidewalls joining to form a sharp edge at the intersection of the sidewalls and wherein radiusing includes removing said sharp corner edges of rounding the sharp edge to create a rounded edge at the intersection.

3. The method of claim 1 wherein radiusing includes mechanical polishing of said edges.

4. The method of claim 1 wherein radiusing includes chemically rounding of said edges.

5. The method of claim 1 wherein radiusing includes electrically rounding of said edges.

6. A method of making contact pins for use in integrated circuit testing where said pins have sidewalls which join at edges which are initially sharp edges and which some of the edges are then selectively radiused comprising the steps of:
 a. forming a blank of planar material;
 b. defining an outline of a pin on the blank;
 c. cutting the blank along said outline to physically separate the pin from the blank;
 d. coating a portion of the pin with a chemical resist coating material in areas where radiusing is not desired;
 e. chemically smoothing the pin, without smoothing such portions of the pins which are coated with chemical resist coating;
 f. removing the coating material;
 so that a planar pin which results has edges which are radiused and edges which are not radiused.

7. The method of claim 6 wherein uncoated edges of said pin are chemically radiused.

8. The method of claim 7 wherein said chemical radiusing cannot reach said coated areas.

9. The method of claim 8 wherein removing the coating material includes immersing the pin into a bath of chemical solution capable or removing the coating material without affecting the pin edges.

10. A method of making planar contact pins for use in integrated circuit testing where said pins have sidewalls which join at edges which are initially sharp edges and which some of the edges are then selectively radiused comprising the steps of:
 a. forming a blank of planar material;
 b. defining an outline of a pin on the blank;
 c. cutting the blank along said outline to partially separate from the blank to formed a partially formed pin, with a portion of the outline still uncut and remaining within the blank;
 d. chemically radiusing all edges of the partially formed pin while said pin is still attached to said blank;
 e. cutting the blank away from the portion of the outline to fully singulate the pin from the blank and thereby creating sharp corner edges on the pin which has not been radiused; so that a planar pin is formed with both radiused edges portion and not radiused edges portion on the planar pin and different portions thereof.

\* \* \* \* \*